United States Patent [19]

Betts et al.

[11] Patent Number: 4,677,626
[45] Date of Patent: Jun. 30, 1987

[54] SELF-SYNCHRONIZING INTERLEAVER FOR TRELLIS ENCODER USED IN WIRELINE MODEMS

[75] Inventors: William L. Betts, St. Petersburg; Kenneth Martinez, Pinellas Park, both of Fla.

[73] Assignee: Paradyne Corporation, Largo, Fla.

[21] Appl. No.: 707,085

[22] Filed: Mar. 1, 1985

[51] Int. Cl.[4] .................... G06F 11/10; H03M 13/22
[52] U.S. Cl. ............................. 371/43; 340/347 DD; 371/2; 375/26; 375/39
[58] Field of Search .................... 371/43–45; 340/347 DD; 375/25, 26, , 34, 39, 67; 36/39–42

[56] References Cited

U.S. PATENT DOCUMENTS 4,015,238  3/1977  Davis ..................................... 371/43
4,130,818  12/1978  Snyder, Jr. ............................ 371/43

Primary Examiner—T. J. Sloyan
Attorney, Agent, or Firm—Kane, Dalsimer, Sullivan, Kurucz

[57] ABSTRACT

In the transmitter of a data communication system using QAM, a trellis coder with k-baud delay units is used for forward error correction. The output of the encoder is modulated using QAM to generate sequential baud signal elements. The redundant data bits generated are distributed among several non-consecutive bauds. At the receiver a plurality of distributed convolutional decoders are utilized to decode the received signal element. The distributed trellis decoder is self-synchronizing.

2 Claims, 3 Drawing Figures

SELF-SYNCHRONIZING INTERLEAVER FOR TRELLIS ENCODER USED IN WIRELINE MODEMS

RELATED APPLICATIONS

The subject matter of this application is related to U.S. applications Ser. No. 707,084 entitled *Distributed Trellis Encoder*, and Ser. No. 707,083 entitled *Self-Synchronizing De-Interleaver for Viterbi Decoder Used in Wireline Modems*, filed on even date herewith and incorporated herein by reference.

BACKGROUND OF THE INVENTION

1. Field of the Invention

This invention pertains to an apparatus and method of encoding binary bits and more particularly to a method and apparatus for making use of a forward error correction scheme for a reduced number of errors at a given signal-to-noise ration.

2. Background of the Invention

Communication networks using high speed data rates require high signal-to-noise ratios for proper data transmission. Numerous schemes and combinations thereof have been proposed to reduce the number of errors at these given signal-to-noise rations. For example, in U.S. Pat. No. 4,077,021 to Csajka et al. a forward error correcting scheme is described making use of the so-called Viterbi algorithm. In a further development described by the CCITT study group XVII, Contribution No. D180, in October, 1983, entitled TRELLIS-CODED MODULATION SCHEME WITH 8-STATE SYSTEMATIC ENCODER AND 90 SYMMETRY FOR USE IN DATA MODEMS TRANSMITTING 3-7 BITS PER MODULATION INTERVAL a two-dimensional trellis for a quadrature amplitude modulation scheme is disclosed having 90° symmetry which results in a 4 db gain in the signal-to-noise ratio. Typically in forward error coding, redundant bits are added systematically to the data bits so that normally only predetermined transitions from one sequential group of bits (corresponding to bauds) to another are allowed. There is an inherent correlation between these redundant bits over consecutive bauds. At the receiver each baud is tentatively decoded and then analyzed based on past history, and the decoded bits are corrected if necessary. However, it was found that certain types of relatively long error signals, such as for example, low frequency phase jitter, cause a constant phase error in the signal constellation for extended (consecutive baud) periods of time. This type of error prevents or inhibits the correction of the received bits using the schemes described above.

OBJECTIVES AND SUMMARY OF THE INVENTION

A principal objective of the present invention is to provide a device and method for data communication in which the effects of long bursts of error signals such as low frequency phase jitter are minimized.

A further objective is to provide a method of adapting a standard modem to perform the subject method and to provide a method that is self-synchronizing.

Other objectives and advantages of the invention shall become apparent from the following description of the invention.

In the present invention the correlation of the redundant bits of different baud signals is distributed in time prior to encoding at the transmitter. A distributed trellis encoding system scheme is used to obtain the redundant bits. At the receiver the received bauds are decoded using a plurality of distributed decoders which extract samples from multiple bauds for trellis decoding. Advantageously, the distribution and trellis encoding are performed by the same elements thereby reducing the cost and complexity of the device. The result is similar to that achieved by interleaving but avoids synchronization problems associated with the conventional complex interleaving processes.

DETAILED DESCRIPTION OF THE INVENTION

Figure 1:
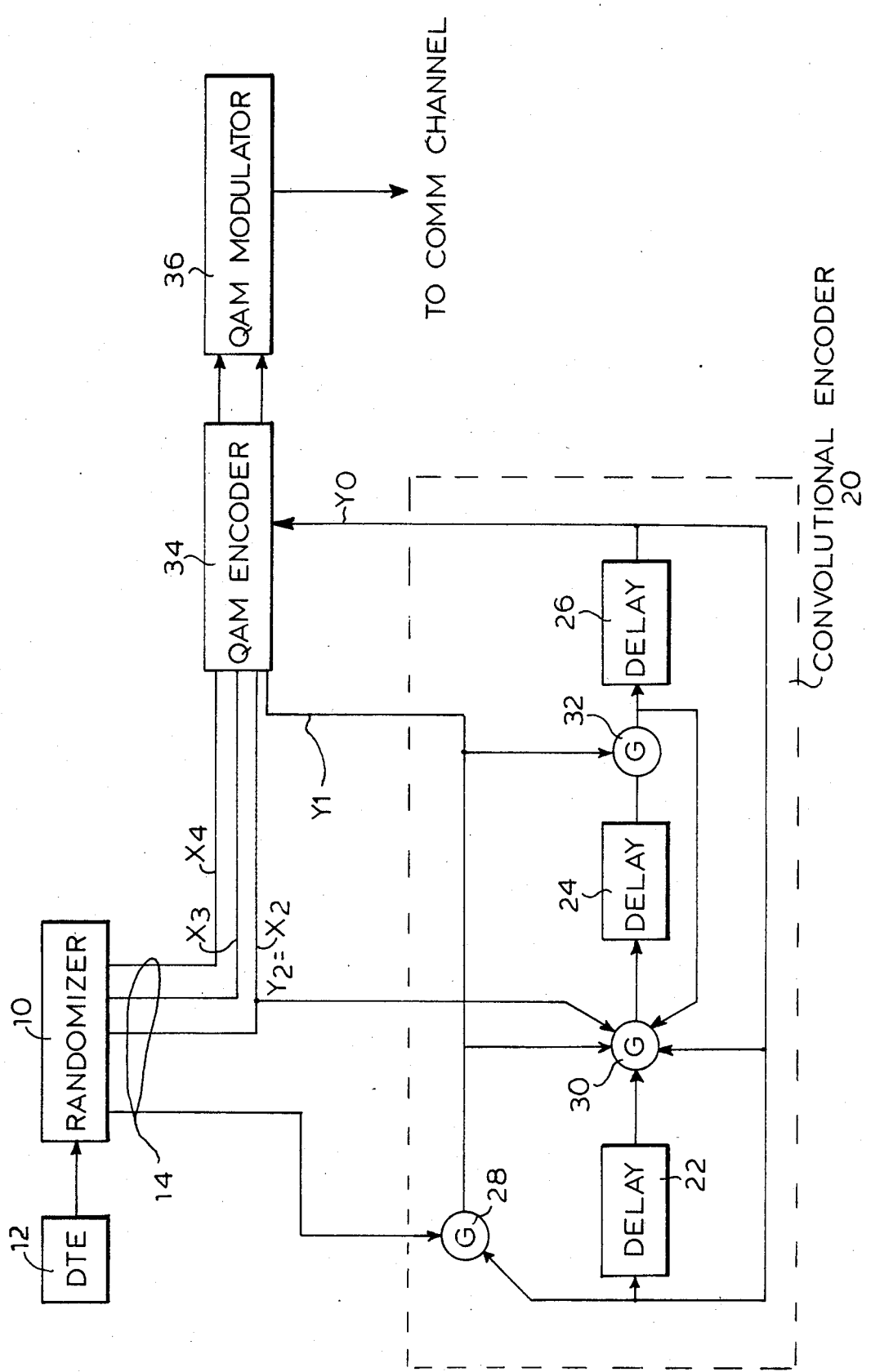
FIG. 1 shows the elements of a data transmitter constructed in accordance with the invention.

As shown in FIG. 1, a transmitter according to this invention comprises a randomizer 10 which receives serially a stream of data bits from DTE 12. The randomizer scrambles the bits in a preselected pattern and generates randomized bits on parallel output lines 14 identified as X1, X2, X3 and X4.

Two of these output lines (X1 and X2) are used as inputs to a convolutional encoder circuit 20. The purpose of the convolutional encoder is to generate three output signals $Y_0$, $Y_1$, $Y_2$ corresponding to input signals $X_1$ and $X_2$ from the randomizer.

The convolutional encoder comprises three delay units 22, 24 and 26 which are adapted to generate a delay of k baud periods each. The encoder further comprises three large XOR (exclusive-OR) gates 28, 30 and 32. The difference between the prior art convolutional encoders and the present decoder comprises the use of K baud delay periods instead of the normal one baud delay period. It is obvious from FIG. 1 that at any time T, $Y_1$, $Y_2$, $Y_0$ are given by:

$$Y_0(T) = C_3(T-k)$$

$$Y_1(T) = X_1(T) * Y_0(T) * C_2(T)$$

$$Y_2(T) = X_2(T)$$

where * denotes an exclusive-OR operation and where $C_2(T)$ and $C_3(T)$ are the respective outputs of XOR gates 30 and 32 respectively, at T, or $$C_2(T) = Y_0(T) * Y_1(T) * Y_2(T) * Y_0(T-k) * C_3(T);$$

and $$C_3(T) = Y_1(T) * C_2(T-k).$$

The three output bits ($Y_0$, $Y_1$, $Y_2$) of the distributed trellis encoder 20 and the remaining output bits of the randomizer 10 are fed to a QAM encoder 34 which converts these bits into a baud signal which may be represented as a point of a QAM signal constellation and transmitted to a communication channel using QAM modulator 36. Such encoders and modulators are well known in the art. The period of the QAM signals from QAM modulator 36 is equal to the above-mentioned baud period.

The bit samples of randomizer 10 could be represented as,

B1 B2 B3 B4 B5 B6 B7 B8 B9 B10 B11 B12 . . .

and the associated baud samples of randomizer 10 using a 4 bits/baud QAM scheme can be shown as,

| | | |
|---|---|---|
| $X4_1 = B4$ | $X4_1 = B8$ | $X4_3 = B12$ |
| $X3_1 = B3$ | $X3_2 = B7$ | $X3_3 = B11 \ldots$ |
| $X2_1 = B2$ | $X2_2 = B6$ | $X2_3 = B10$ |
| $X1_1 = B1$ | $X1_2 = B5$ | $X1_3 = B9$ | then the encoded baud samples output from distributed trellis encoder 20 would be,

| | | |
|---|---|---|
| $Y4_1$ | $Y4_2$ | $Y4_3$ |
| $Y3_1$ | $Y3_2$ | $Y3_3$ |
| $Y2_1$ | $Y2_2$ | $Y2_3$ |
| $Y1_1$ | $Y1_2$ | $Y1_3 \ldots$ |
| $Y0_1$ | $Y0_2$ | $Y0_3$ | where the Y output bits are related to the X input bits by the following relationships.

| | |
|---|---|
| $Y4_1 = X4_1$ | $Y4_2 = X4_2$ |
| $Y3_1 = X3_1$ | $Y3_2 = X3_2$ |
| $Y2_1 = X2_1$ | $Y2_2 = X2_2$ |
| $Y1_1 = f(X1_1, Y0_{1-k})$ | $Y1_2 = f(X1_2, Y0_{2-k})$ |
| $Y0_1 = f(Y0_{1-k})$ | $Y0_2 = f(Y0_{2-k})$ |

If for example K=5 then encoded consecutive baud samples 10, 11 and 12 can be shown as follows:

| | | |
|---|---|---|
| $Y4_{10} = X4_{10}$ | $Y4_{11} = X4_{11}$ | $Y4_{12} = X4_{12}$ |
| $Y3_{10} = X3_{10}$ | $Y3_{11} = X3_{11}$ | $Y3_{12} = X3_{12}$ |
| $Y2_{10} = X2_{10}$ | $Y2_{11} = X2_{11}$ | $Y2_{12} = X2_{12}$ |
| $Y1_{10} = f(X1_{10}, Y0_5)$ | $Y1_{11} = f(X1_{11}, Y0_6)$ | $Y1_{12} = f(X1_{12}, Y0_7)$ |
| $Y0_{10} = f(Y)_5)$ | $Y0_{11} = f(Y0_6)$ | $Y0_{12} = f(Y0_7)$ |

Note that $Y0_{10}$ has no correlation with $Y0_{11}$ or $Y0_{12}$ so that long error signals less than K=5 bauds in duration do not effect the redundant information in $Y0_{10}$.

In effect the bits of several consecutive signals are spaced out over several bauds by the distributed trellis encoders.

Figure 2:
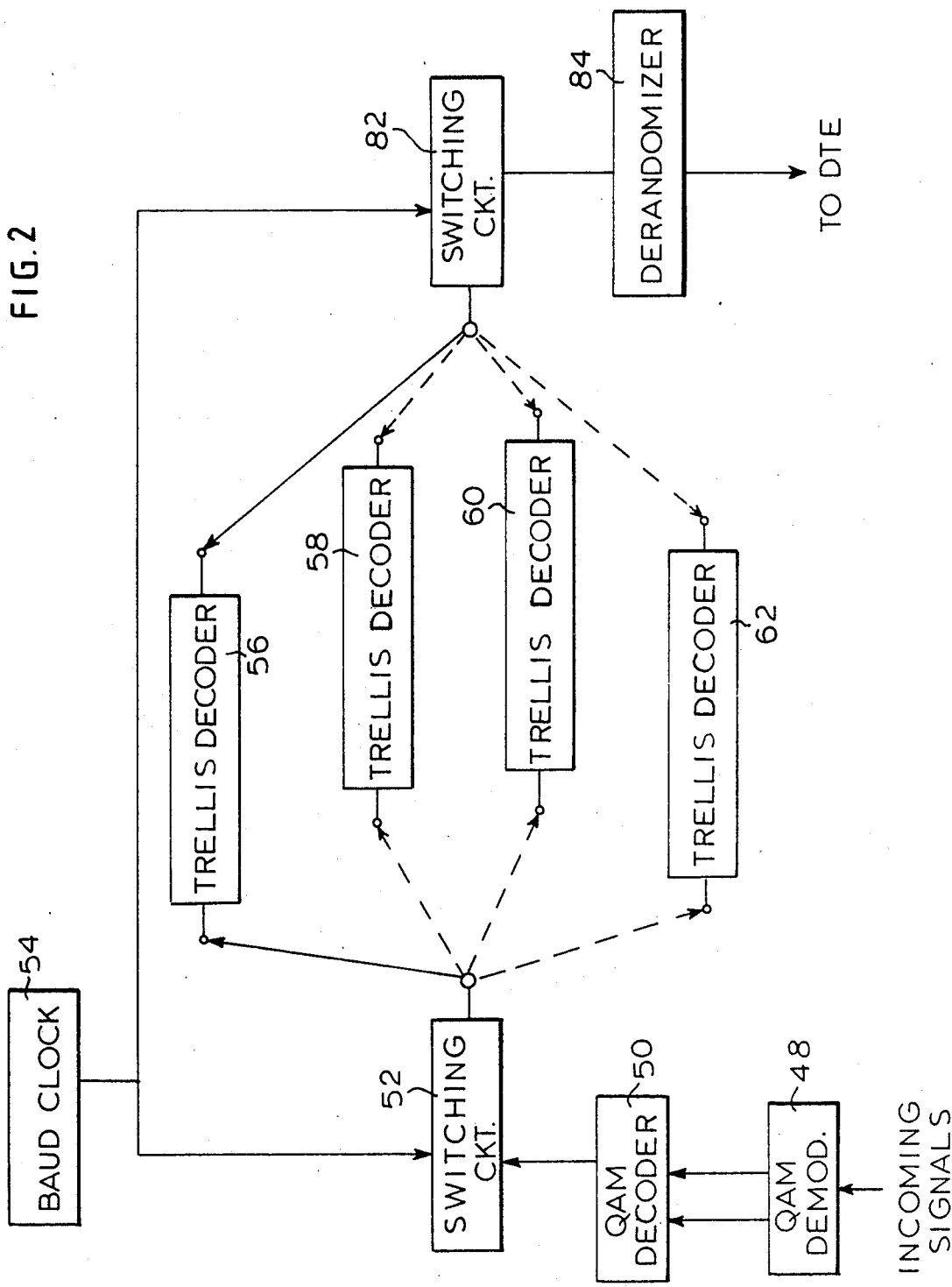
FIG. 2 shows the elements of a receiver for receiving data from the transmitter of FIG. 1.
Figure 3:
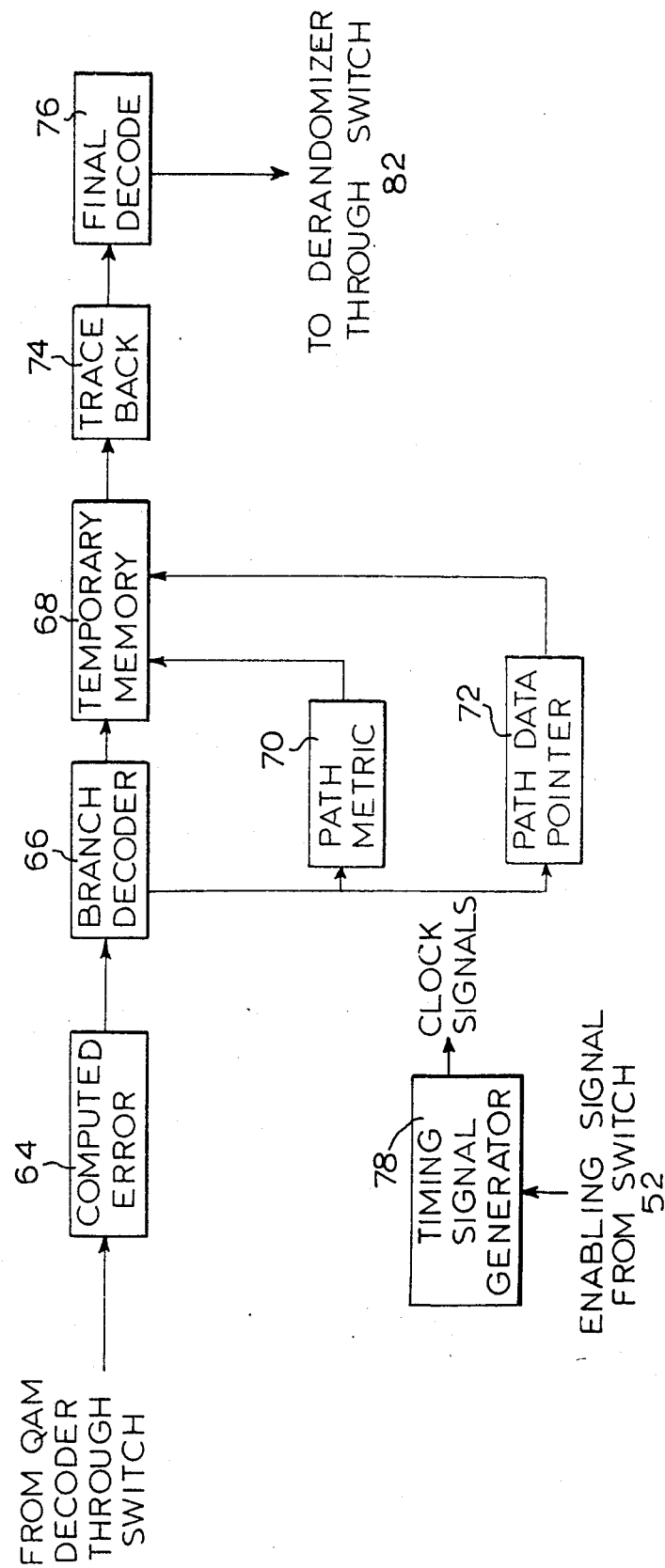
FIG. 3 shows details of a typical trellis decoder.

At the receiver, illustrated in FIG. 2, the incoming analog signals are demodulated by a QAM demodulator 48 which generates an in-phase and a quadrature signal which are fed to a QAM decoder 50. The QAM decoder 50 selects a point on the signal constellation closest to the actual point corresponding to the signals received from QAM demodulator 48. The bits corresponding to said point are sent to a third electronic switching circuit 52 having a period equal to the baud period of the received signals. Circuit 52 accesses sequentially one of four distributed trellis decoders 56, 58, 60 and 62 in response to the switching signal from generator 54. For the sake of simplicity only four trellis decoders are shown. However, it should be understood that the number of required trellis decoders is equal to k, the delay period of the trellis encoder delay elements. All the binary signals from QAM decoder 50 corresponding to each received QAM signal are sent to one of the trellis decoders. The four trellis decoders are standard decoders well known in the art. One such decoder is shown in FIG. 3.

In a typical trellis decoder, the signals from the QAM decoder (in the present case, via switching circuit 52) are fed into an error computer circuit 64 which generates an error signal based on previously received signals. This error signal is fed to a branch decoder 66. The branch decoder uses the trellis branch rules (predetermined in accordance with the Viterbi algorithm) to generate a set of possible points corresponding to the received point. This set of points are stored in temporary memory 68. The decoder then searches through the points of the set to calculate the point with the smallest errors in accordance with appropriate constants stored in the path metric memory 70 and path pointer memory 72. The smallest error is used by trace back memory 74 to track back the last 4-16 bauds (in accordance with a preselected well-known scheme) to generate the final received point. The final received point of the set of points in memory 68 is fed to final decoder 76 as the received point.

Each decoder comprises digital elements which are enabled by a timing signal generator 78.

The timing signal generator is enabled by an appropriate signal from switching circuit 52 only when the respective decoder is addressed by the switching circuit. Generator 78 generates clocking signals for the various decoder elements. Thus each decoder 56, 58, 60 and 62 is active only when it is addressed by switching circuit 52, and otherwise it is idle.

The output of each decoder is accessed sequentially by a fourth electronic switching circuit 82 which is synchronized by the baud clock generator 54 so that it is in step with switching circuit 52. In other words, each trellis decoder is accessed simultaneously by switch circuits 52 and 82. The switching circuit 82 feeds the signals from the decoders to derandomizer 84 for reversing the effects of randomizer 10 and then to a user DTE.

It can be seen from the above description that the switch circuits 42 and 82 act as demultiplexers. The effect of this switching is to interleave the data bits at the transmitter across four bauds, and deinterleave these bits at the receiver. Obviously the trellis encoders are self-synchronized so that no synchronizing signals are needed between the transmitter and receiver In the above description consecutive bits are interleaved across four bauds. Obviously if k is increased and k decoders are used the number of bauds over which interleaving occurs increases.

It should be appreciated that the invention makes use of standard QAM encoders, modulators, decoders, demodulators and standard trellis decoders which are well known in the art. Furthermore, while baud clock generator 54 is described as a separate element, in practice it can be incorporated in the QAM demodulator. All the circuits of FIGS. 1 and 2 may be implemented by using a digital microprocessor.

Obviously, numerous modifications to the subject application may be made without departing from the scope of the invention as defined in the appended claims.

What is claimed is:

1. In a communication system for exchanging convolutionally encoded digital signals, with predetermined baud periods, each having a duration D, a transmitter comprising:

input means for providing n data bits each baud period;

a convolutional encoder having delay means for delaying at least one bit of each group of bits received by the encoder from said input means by a duration kD, k being larger than two, and gating means for interleaving consecutive input bits over k-bauds;

a QAM encoder having means for combining groups of bits received directly from said input means with groups of bits received from said convolutional encoder and delayed by k bauds, said QAM encoder also having means for encoding said combined groups of bits; and QAM modulating means for generating said convolutionally encoded signals.

2. The system of claim 1 wherein said delay means comprises a plurality of delay circuits, each circuit generating a delay of Kd, each delay circuit feeding an output signal to said gating means.

* * * * *